(12) United States Patent
Yagi

(10) Patent No.: US 6,828,594 B2
(45) Date of Patent: Dec. 7, 2004

(54) SEMICONDUCTOR LIGHT EMISSION ELEMENT, SEMICONDUCTOR COMPOSITE ELEMENT AND PROCESS FOR PRODUCING SEMICONDUCTOR LIGHT EMISSION ELEMENT

(75) Inventor: Shigeru Yagi, Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 10/283,091

(22) Filed: Oct. 30, 2002

(65) Prior Publication Data

US 2003/0178629 A1 Sep. 25, 2003

(30) Foreign Application Priority Data

Mar. 19, 2002 (JP) ........................................ 2002-076202

(51) Int. Cl.$^7$ .............................................. H01L 33/00
(52) U.S. Cl. ............................ 257/96; 257/13; 257/22; 257/94; 257/85; 257/103; 438/47
(58) Field of Search .............................. 257/13, 22, 84, 257/85, 94, 96, 103; 438/47

(56) References Cited

U.S. PATENT DOCUMENTS

| | | | | |
|---|---|---|---|---|
| 5,097,298 A | * | 3/1992 | Ehara ........................... | 257/94 |
| 5,228,044 A | * | 7/1993 | Ohba ........................... | 372/45 |
| 6,355,945 B1 | * | 3/2002 | Kadota et al. ................. | 257/82 |

OTHER PUBLICATIONS

Nakamura et al., "High–Power GaN P–N Junction Blue–Light–Emitting Diodes", Japanese Journal of Applied Physics, vol. 30, No. 12A, Dec. 1991, pp. L1998–L2001.

Nakamura et al., "Ridge–geometry InGaN multi–quantum–well–structure laser diodes", Applied Physics Letters, vol. 69, p. 1477, Sep. 2, 1996.

Hirschman et al., "Silicon–based visible light–emitting devices integrated into microelectronic circuits", Nature, vol. 384, p. 338, Nov. 28, 1996.

Fujita et al., "Visible light–emitting devices with Schottky contacts on an ultrathin amorphous silicon layer containing silicon nanocrystals", Applied Physics Letters, vol. 74, No. 2, p. 308, Jan. 11, 1999.

Guha et al., "Ultraviolet and violet GaN light emitting diodes on silicon", Applies Physics Letters, vol. 72, p. 415, Jan. 26, 1998.

Tran et al., "Growth of InGaN/GaN multiple–quantum–well blue light–emitting diodes on silicon by metalorganic vapor phase epitaxy", Applied Physics Letters, vol. 75, No. 11, p. 1494, Sep. 13, 1999.

Feltin et al., "Green InGaN Light–Emitting Diodes Grown on Silicon (111) by Metalorganic Vapor Phase Epitaxy", Japanese Journal of Applied Physics, vol. 40, p. L738, Jul. 15, 2001.

* cited by examiner

*Primary Examiner*—Jerome Jackson
(74) *Attorney, Agent, or Firm*—Oliff & Berridge, PLC

(57) ABSTRACT

A simple and low cost semiconductor light emission element exerting high performance and a process for producing the same are provided. The semiconductor light emission element contains a nitride semiconductor layer containing at least one or more element selected from Group IIIA elements and one or more element selected from Group VA element, a dissimilar semiconductor having a polarity different from the nitride semiconductor layer, and a light emission layer provided between the dissimilar semiconductor and the nitride semiconductor, in which electrons or positive holes are injected from semiconductors of the dissimilar semiconductor and the nitride semiconductor layer to the light emission layer to carry out light emission.

19 Claims, 3 Drawing Sheets

SEMICONDUCTOR LIGHT EMISSION ELEMENT, SEMICONDUCTOR COMPOSITE ELEMENT AND PROCESS FOR PRODUCING SEMICONDUCTOR LIGHT EMISSION ELEMENT

BACKGROUND OF THE INVENTION

1. Field of the Invention

The present invention relates to a semiconductor light emission element using a nitride semiconductor, a semiconductor composite element and a process for producing a semiconductor light emission element.

2. Description of the Related Art

Wide band gap semiconductors have been receiving attention as a semiconductor for a blue light emission element in recent years (S. Nakamura, T. Mukai and M. Senoh, *Jpn.J. Appl. Phys.*, vol. 30, L1998 (1991); and S. Nakamura, M. Senoh, S. Nagahama, N. Iwata, T. Yamada, M. Matsushita, Y. Sugimoto and H. Kiyoku, *Appl. Phys. Lett.*, vol. 69, p. 1477 (1996)). Among them, nitride semiconductors (nitride compound semiconductors) are receiving attention as the wide band gap semiconductor.

However, the nitride semiconductors are often produced by a two-step growth, in which a low temperature buffer layer is firstly formed by using a sapphire substrate, and after increasing the temperature to about 1,000° C., crystal growth is carried out at a high temperature of 1,000° C.

With respect to silicon semiconductors, which constitute major portion of semiconductor elements, such as LSI, there has been an attempt that light is emitted from silicon to carry out transmission between chips and within a chip with light (K. D. Hirschman, L. Tsybeskov, S. P. Duttagupta and P. M. Fauchent, *Nature*, vol. 384, p. 338 (1996) and S. Fujita and N. Sugiyama, *Appl. Phys. Lett.*, vol. 74, p. 308 (1999)).

However, silicon cannot emit light as it is because it is an indirect transition semiconductor. Therefore, direct transition III-V compound semiconductors (nitride semiconductors), which emit light, are formed on silicon, but it is the current situation that there is a problem in that crystals of high quality cannot be grown. It is considered that this is because there are excess bonding linkages left severed (dangling bonds) at the junction interface of the two different semiconductors having different lattice constants and they form interface levels. Particularly, in the case where there is a large difference in thermal expansion coefficient between the two semiconductors, it is considered that large stress is formed after cooling because a high temperature is applied upon forming the nitride semiconductor, whereby not only the formation of junction defects is accelerated, but also structural defects, such as cracking, crazing and interfacial exfoliation, are caused.

It is the current situation of the semiconductor light emission element obtained by forming the direct transition III-V compound semiconductors (nitride semiconductor), which emit light, on silicon, that the characteristics of the junction interface are deteriorated by the formation of a large amount of interfacial level at the junction interface, and sufficient characteristics as a semiconductor light emission element cannot be brought out.

Such a semiconductor light emission element is also studied that a nitride semiconductor is formed on a dissimilar semiconductor substrate formed with inexpensive Si or GaAs, which is different from the sapphire substrate or the nitride semiconductor. However, two-step growth is carried out for growing the nitride semiconductor by using a buffer layer formed with GaN, AlN or ZnO, and therefore, the semiconductor substrate formed with the dissimilar semiconductor, such as Si and GaAs, functions only as a substrate to grow the nitride semiconductors but does not serve as a semiconductor light emission element. (Supratik Guha and Nestor A. Bojarczuk, *Appl. Phys. Lett.*, vol. 72, p. 415 (1998), Chuong A. Tran, A. Osinski and R. F. Karlicek, Jr., *Appl. Phys. Lett.*, vol. 75, p. 1494 (1999), and E. Feltin, S. Dalmasso, P. Mierry, B. Beaumont, H. Lahreche, A. Bouille, H. Haas, M. Leroux and P. Gibart, *Jpn. J. Appl. Phys.*, vol. 40, L738 (2001))

While a heterogeneous junction between nitride semiconductors has been realized by a quantum well structure, the heterogeneous junction to the dissimilar semiconductor, such as Si and GaAs, is difficult to be formed as noted in the foregoing. Furthermore, there are such problems that the nitride semiconductor crystals are formed by providing a buffer layer, such as GaN, AlN and ZnO, at the interface to the dissimilar semiconductor, and the semiconductor junction cannot be directly formed.

As described in the foregoing, in the semiconductor light emission element having a constitution containing a nitride semiconductor layer and a dissimilar semiconductor (semiconductor substrate) different therefrom, the nitride semiconductor layer and the dissimilar semiconductor (semiconductor substrate) are formed through the buffer layer, such as GaN, AlN and ZnO, having insulating property, and the dissimilar semiconductor does not contribute to injection of charge (electrons or positive holes), whereby a large number of layers are required, and problems in cost are caused. Furthermore, in the case where the dissimilar semiconductor (semiconductor substrate) is shared by the other elements, and driving circuits and wiring from the other elements are formed on the semiconductor substrate in parallel with the semiconductor light emission element, the elements are not formed directly on the semiconductor substrate, and the semiconductor substrate does not electrically function by itself. As a result, there are problems of complex layer structure and high production cost, and it is the current situation that a composite element that has plural elements having different functions is difficult to be formed on the same semiconductor substrate.

SUMMARY OF THE INVENTION

The invention is to solve the foregoing problems associated with the conventional art to provide a simple and low cost semiconductor light emission element exerting high performance and a process for producing the same.

The invention is also to provide such a semiconductor light emission element capable of forming a semiconductor composite element that has plural semiconductor elements having different functions on the same dissimilar semiconductor (semiconductor substrate) and has high performance and a simple structure, and to provide the semiconductor composite element.

The invention provides, as one aspect, a semiconductor light emission element containing a nitride semiconductor layer at least containing one or more elements selected from Group IIIA elements and one or more elements selected from Group VA elements, a semiconductor having a polarity different from the nitride semiconductor layer and being dissimilar to the nitride semiconductor layer, and a light emission layer provided between the dissimilar semiconductor and the nitride semiconductor, wherein electrons or positive holes are injected from semiconductors of the dissimilar semiconductor and the nitride semiconductor layer to the light emission layer to carry out light emission.

BRIEF DESCRIPTION OF THE DRAWINGS

Preferred embodiments of the invention will be described in detail based on the following figures wherein.

DESCRIPTION OF THE PREFERRED EMBODIMENTS

Figure 1:
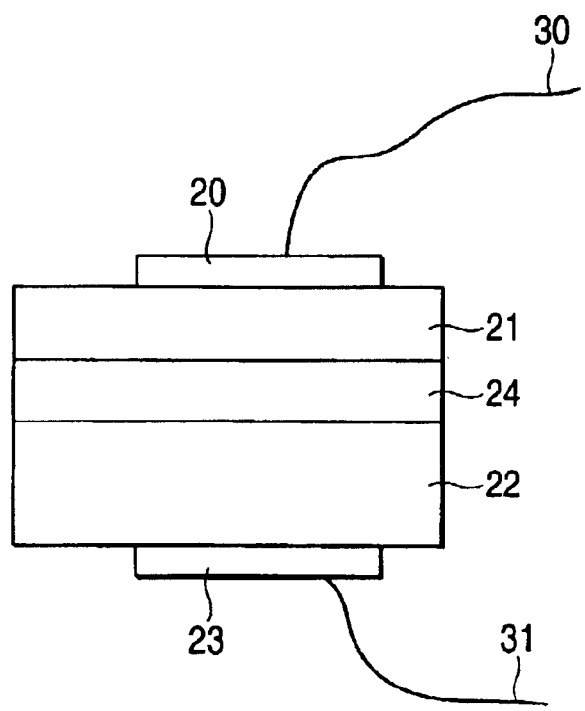
FIG. 1 is an enlarged cross sectional view showing one example of the constitution of the semiconductor light emission element of the invention.

The invention will be described in detail below.

The semiconductor light emission element of the invention contains a nitride semiconductor layer at least containing one or more elements selected from Group IIIA elements and one or more elements selected from Group VA elements, a dissimilar semiconductor having a polarity different from the nitride semiconductor layer, and a light emission layer provided between the dissimilar semiconductor and the nitride semiconductor, in which electrons or positive holes are injected from semiconductors of the dissimilar semiconductor and the nitride semiconductor layer to the light emission layer to carry out light emission.

The semiconductor light emission element of the invention is formed by providing, on a surface of a p-type or n-type dissimilar semiconductor, a nitride semiconductor layer having a polarity different from the dissimilar semiconductor (hereinafter referred to as a nitride semiconductor layer contributing to charge injection) at least containing one or more elements selected from Group IIIA elements and one or more elements selected from Group VA elements through a light emission layer, so as to form a semiconductor junction with the dissimilar semiconductor and the nitride semiconductor layer contributing to charge injection. For example, an n-type nitride semiconductor layer contributing to charge injection containing one or more element selected from C, Si, Ge and Sn is formed on a p-type dissimilar semiconductor, or a p-type nitride semiconductor layer contributing to charge injection containing one or more element selected from Be, Mg, Ca, Zn and Sr is formed on an n-type dissimilar semiconductor. According to the configuration, junctions having different band gaps are formed at interfaces between the nitride semiconductor layer contributing to charge injection and the dissimilar semiconductor through the light emission layer to obtain a large diffusion potential and excellent injection characteristics of carriers, and thus a simple and low cost semiconductor light emission element exerting high performance can be obtained, in which electrons or positive holes are injected from the semiconductors of the dissimilar semiconductor and the nitride semiconductor layer contributing to charge injection to the light emission layer in high efficiency with a simple structure.

Dissimilar Semiconductor

The dissimilar semiconductor is not particularly limited as far as it is a dissimilar semiconductor that has a polarity different from that of the nitride semiconductor layer contributing to charge injection described later. There are some cases in the invention where the dissimilar semiconductor also functions as a semiconductor substrate for forming the light emission layer and the nitride semiconductor layer contributing to charge injection described later. As the dissimilar semiconductor, semiconductors containing no N are preferred, and preferred examples thereof include semiconductor substrates formed with semiconductors mainly containing one or more element selected from C, Si and Ge, and semiconductors mainly containing one or more element selected from Group IIIA elements (Group No. 13 in Revised Edition of IUPAC Nomenclature of Inorganic Chemistry in 1989) and one or more element selected from P and As. Examples thereof also include semiconductors mainly containing one or more element selected from Group IV elements, such as Ge and diamond, and semiconductors mainly containing an oxide, such as titanium oxide. They may have either p-type conductivity or n-type conductivity.

Among these, semiconductors mainly containing silicon and semiconductors mainly containing one or more element selected from Group IIIA elements (Group No. 13 in Revised Edition of IUPAC Nomenclature of Inorganic Chemistry in 1989) and one or more element selected from P and As are preferably used from the standpoint of easiness in controlling p-type or n-type conductivity and easiness in using as a substrate.

In the case where the semiconductor mainly containing silicon is used as the dissimilar semiconductor, the silicon is preferably crystalline silicon, polycrystalline silicon, microcrystalline silicon or amorphous silicon. Examples of the semiconductor mainly containing one or more element selected from Group IIIA elements (Group No. 13 in Revised Edition of IUPAC Nomenclature of Inorganic Chemistry in 1989) and one or more element selected from P and As include GaAs, GaAlAs, GaAlP, GaP, AlGaP, InP, InGaP, InAlP and GaAsN.

It is particularly preferred that silicon or GaAs is used as the dissimilar semiconductor.

Light Emission Layer

The light emission layer is formed directly on the dissimilar semiconductor, and preferred examples thereof include a compound layer having luminescence centers added, a fluorescent compound layer containing a fluorescent inorganic compound, and a nitride semiconductor layer containing one or more element selected from Group IIIA elements and one or more element selected from Group VA elements.

Examples of the compound layer having luminescence centers added as the light emission layer include those having a thin film of an organic dye or pigment formed by vapor deposition as the luminescence centers. Examples of the fluorescent compound layer containing a fluorescent inorganic compound include a compound layer at least containing one or more elements selected from Group IIIA elements with carbon and/or oxygen.

It is preferred from the standpoint of light emission efficiency that a rare earth element is added (doped) to the nitride semiconductor layer as the light emission layer.

Preferred embodiments thereof are the same as those in the nitride semiconductor layer contributing to charge injection described later.

The nitride semiconductor layer and the compound layer as the light emission layer may be either crystalline, amorphous, microcrystalline or polycrystalline. It is preferred from the standpoint of light emission efficiency that the nitride semiconductor layer as the light emission layer has a quantum well structure.

Specifically, such a structure is preferred that the light emission layer has, as a quantum well structure, one or more pairs of a first layer at least containing one or more elements selected from Group IIIA elements and one or more elements selected from Group VA elements and a second layer at least containing one or more elements selected from Group IIIA elements and having an optical gap smaller than the first layer, each of which has a thickness of from 5 to 200 Å (preferably from 5 to 100 Å), sequentially accumulated, and a third layer having the same composition as the first layer further accumulated. The first layers and the third layer correspond to well layers, whereas the second layers correspond to barriers for forming a quantum well, and the quantum well structure is formed thereby. It is preferred in the second layers that the ratio x/y of the total amount x of the Group IIIA elements (elements of Al, Ga and In) to the amount y of the Group VA element (N) is in a range of from 0.5/1.0 to 1.0/0.5. In order to control the p/n type of the first to third layers, one or more element selected from C, Si, Ge and Sn may be further added to form an n-type, or in alternative, at least one or more elements selected from Be, Mg, Ca, Zn and Sr may be further added to form a p-type. At this time, a polarity that is different from that of the dissimilar semiconductor is preferably formed. Preferred embodiments of the first to third layers are the same as in the nitride semiconductor layer contributing to charge injection described later.

The thickness of the light emission layer is generally about from 0.5 to 2,000 nm. When the thickness of the light emission layer is less than 0.5 nm, there are some cases where electrons or positive holes injected from the dissimilar semiconductor and the nitride semiconductor layer contributing to charge injection are caught by non-radiation recombination centers at an interface with the light emission layer. When the thickness is more than 2,000 nm, there are some cases where an electric field applied to the light emission layer is lowered, or the operation voltage of the entire semiconductor light emission element becomes high.

Nitride Semiconductor Layer Contributing to Charge Injection

The nitride semiconductor layer contributing to charge injection contains one or more element selected from Group IIIA elements (Group No. 13 in Revised Edition of IUPAC Nomenclature of Inorganic Chemistry in 1989) and one or more element selected from Group VA elements (Group No. 15 in Revised Edition of IUPAC Nomenclature of Inorganic Chemistry in 1989) and further contains, depending on necessity, other components.

Specific examples of the Group IIIA elements include B, Al, Ga, In and Tl, and at least one kind selected from Al, Ga and In is preferred. Examples of the Group VA elements include N, P, As, Sb and Bi, and nitrogen (N) is particularly preferred.

In order to select the relationship in junction energy of an active part at a junction part to the dissimilar semiconductor through the light emission layer, the nitride semiconductor layer contributing to charge injection may be a nitride semiconductor layer formed with Al and/or Ga and nitrogen or a nitride semiconductor layer further containing In in addition thereto. The In concentration is preferably 0<In/(Al+Ga+In)<0.1. Such a junction is also possible that is formed with a semiconductor having an intermediate band gap that is in order to carry out current transportation of a semiconductor light emission element and inhibition by barrier in a further efficient matter.

The nitride semiconductor layer contributing to charge injection may be either single crystalline, amorphous, microcrystalline or polycrystalline, and it is preferred in the case of microcrystalline or polycrystalline that it is inactivated by containing hydrogen or a halogen element in the film since there are large amount of defects, such as junction defects, dislocation defects and crystalline boundaries. Hydrogen and a halogen element are incorporated in the defects, such as junction defects and crystalline boundaries, to exert electric compensation. Accordingly, traps relating to diffusion and migration of carriers are disappeared to exhibit excellent electric characteristics. In order to realize such a state that hydrogen and a halogen element in the crystals are contained in the film, it is preferred that the film formation of the nitride semiconductor layer contributing to charge injection and process steps subsequent thereto are carried out at a low temperature of 600° C. or less. The raw material such as gas or compound for forming the nitride semiconductor layer may be introduced into a reactive chamber and then the layer is formed.

The nitride semiconductor layer contributing to charge injection preferably contains hydrogen and/or halogen atoms in an amount of from 0.1 to 50% by atom, and more preferably from 0.1 to 40% by atom. When the content of hydrogen and/or halogen atoms less than 0.1% by atom, it is insufficient to inactivate defect levels formed in the band by removing junction defects at the crystalline boundaries or junction defects and non-bonded linkages inside the amorphous phase by bonding with hydrogen, and there are some cases where the junction defects and the structural defects are increased.

When the content of hydrogen and/or halogen atoms contained in the nitride semiconductor layer contributing to charge injection exceeds 50% by atom, on the other hand, the probability where two or more hydrogen and/or halogen atoms are bonded to the IIIA Group element and nitrogen is increased to fail to maintain the three-dimensional structure by the elements, but two-dimensional and chain-like networks are formed, whereby a large amount of voids are particularly formed at the crystalline boundaries. As a result, a new level is formed in the band to deteriorate the electric characteristics and to lower the mechanical characteristics including hardness. Furthermore, the nitride semiconductor layer contributing to charge injection is liable to be oxidized to form, as a result, a large amount of impurity defects are formed in the nitride semiconductor layer contributing to charge injection, and there are some cases where good electric characteristics cannot be obtained.

Furthermore, when the content of hydrogen and/or halogen atoms contained in the nitride semiconductor layer contributing to charge injection exceeds 50% by atom, the dopant doped for controlling the electric characteristics is inactivated by the hydrogen and/or halogen atoms, and as a result, there are some cases where an electrically active nitride semiconductor layer contributing to charge injection formed with an amorphous material or microcrystals cannot be obtained.

The amount of hydrogen can be measured in terms of absolute values by hydrogen forward scattering (HFS) and can be estimated from an infrared absorption spectrum.

The nitride semiconductor layer contributing to charge injection may be amorphous, microcrystalline, or polycrystalline as described in the foregoing. The crystalline system may be a mixture of a cubic system and a hexagonal system or one of them. The plane direction may be plural and is preferably a single species. The growth cross section may have a columnar structure or may be a smooth single crystal.

The single crystal herein means those exhibiting, in a transmission electron diffraction pattern and a reflection electron diffraction pattern, mainly spot-like luminescent spots, not ring-like diffraction pattern but luminescent spots substantially equivalent to spot-like shapes, and streak-like luminescent spots, and exhibiting such an X-ray diffraction pattern that one plane direction occupies about 80% or more of the total intensity.

A nitride semiconductor layer having been doped at a different concentration may be inserted (accumulated) between the nitride semiconductor layer contributing to charge injection and the light emission layer. A layer having a higher concentration may be inserted (accumulated) on the side of the light emission layer, or in alternative, a nitride semiconductor layer having a higher concentration may be inserted (accumulated) on the opposite side (side of an electrode). It is preferred that the nitride semiconductor layer having a higher concentration is inserted (accumulated) on the side opposite to the light emission layer (on the side of the electrode). A nitride semiconductor layer having a different composition may be inserted (accumulated) in order to conform to the positions of the bands.

Specifically, for example, the nitride semiconductor layer contributing to charge injection may have an accumulated layer structure containing, from the side of the light emission layer with respect to the p-type dissimilar semiconductor (such as silicon), n-type GaN/n$^+$-type GaN, n-type Al$_{X1}$Ga$_{Y1}$N/n$^+$-type Al$_{X2}$Ga$_{Y2}$N or n-type GaInN/n$^+$-type GaAlN, and an accumulated layer structure containing, from the side of the light emission layer with respect to the n-type dissimilar semiconductor (such as silicon), p-type GaN/p$^+$-type GaN, p-type Ga$_{X1}$In$_{Y1}$N/p$^+$-typeGa$_{X2}$In$_{Y2}$N, p-type GaInN/p-type GaN or p-type GaInN/p$^+$-type GaAlN.

In the semiconductor light emission element of the invention, a p$^+$-type layer or an n$^+$-type layer having the same composition as the nitride semiconductor layer contributing to charge injection doped at a higher concentration may be inserted between the dissimilar semiconductor and the light emission layer, or in alternative, a p$^-$-type layer or an n$^-$-type layer doped at a lower concentration may be inserted between the dissimilar semiconductor and the light emission layer. The ratio x/y of the total amount x of the Group IIIA elements (elements of Al, Ga and In) and the amount y of the Group VA element (N) in the doped nitride semiconductor layer inserted between the dissimilar semiconductor and the light emission layer is preferably in a range of from 0.5/1.0 to 1.0/0.5.

In the semiconductor light emission element of the invention, in order for transparency and formation of barriers, the nitride semiconductor layer for charge injection and p-type, i-type and n-type layers in the nitride semiconductor layer as the light emission layer may have different compositions of Al, Ga, In and N that can be expressed by Al$_x$Ga$_y$In$_z$ (x=0 to 1.0, y=0 to 1.0, and z=1 to 1.0), and the respective p-type, i-type and n-type layers may have plural compositions of Al$_x$Ga$_y$In$_z$N:H (x=0 to 1.0, y=0 to 1.0, and z=1 to 1.0).

In the semiconductor light emission element of the invention, depending on necessity, an electrode of Au, Ni, Al or Ag may be provided on the dissimilar semiconductor and the nitride semiconductor layer contributing to charge injection for applying voltage from the outside. It is preferred that the electrode is formed in an ohmic manner on the surfaces of the dissimilar semiconductor and the nitride semiconductor layer contributing to charge injection. Therefore, it is preferred that the electrode is provided to a thickness of from 0.1 to 5 μm by a vapor deposition method or a sputtering method using Au, Ni, Al or Ag. In the case where light is brought out in the direction of the electrode, the electrode is transparent to the wavelength of emitted light.

Process for Producing Semiconductor Light Emission Element

The nitride semiconductor layers in the semiconductor light emission element (including the nitride semiconductor layer contributing to charge injection and the nitride semiconductor layer as the light emission layer) can be produced in the following manner. However, the production process is not limited thereto. The following production process, uses such an example that at least one or more elements selected from Al, Ga and In is used as the Group IIIA element of the nitride semiconductor layer, nitrogen is used as the Group VA element, and a semiconductor mainly containing silicon is used as the dissimilar semiconductor.

Figure 6:
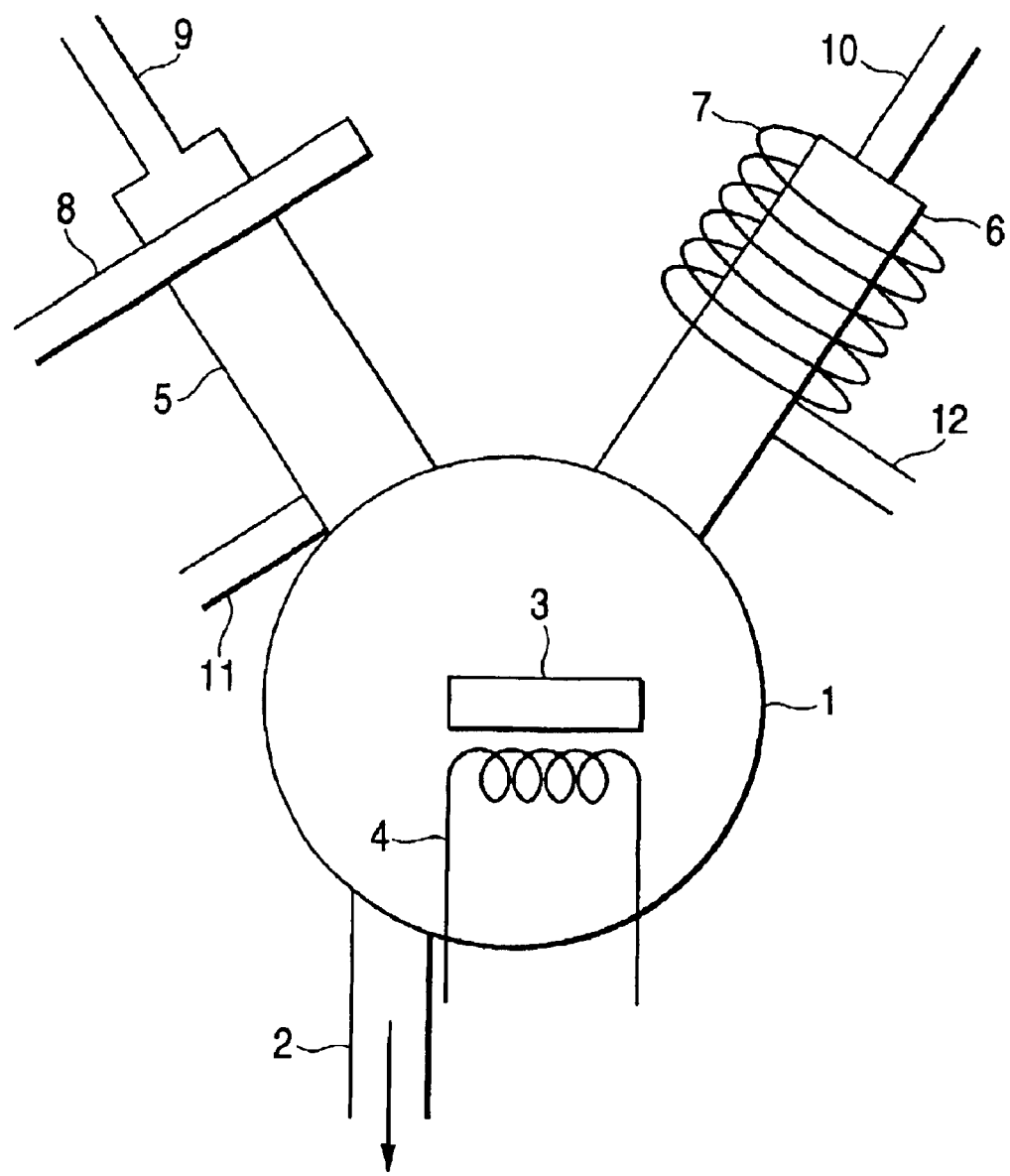
FIG. 6 is a schematic constitutional view showing one preferred example of an apparatus for forming the nitride semiconductor layer used in the invention.

FIG. 6 is a schematic constitutional view showing an apparatus for forming the nitride semiconductor layer used in the invention using plasma as an activation medium.

In FIG. 6, numeral 1 denotes a vessel that can be evacuated to vacuum, 2 denotes an exhaust opening, 3 denotes a substrate holder, 4 denotes a heater for heating a substrate, and 5 and 6 denote quartz tubes connected to the vessel 1, to which gas inlet tubes 9 and 10 are connected. The gas inlet tube 11 is connected to the quartz tube 5, and the gas inlet tube 12 is connected to the quartz tube 6.

In the apparatus, an N$_2$ gas, for example, is used as a nitrogen source and is introduced to the quartz tube 5 through the gas inlet tube 9. Microwave of 2.45 GHz is then supplied to a microwave waveguide tube 8 connected to, for example, a microwave oscillator using magnetron (not shown in the figure) to carry out discharge in the quartz tube 5. Separately, an H$_2$ gas, for example, is introduced to the quartz tube 6 through the gas inlet tube 10. High frequency wave of 13.56 MHz is then supplied to a high frequency wave coil 7 from a high frequency wave oscillator (not shown in the figure) to carry out discharge in the quartz tube 6. Furthermore, trimethyl gallium, for example, is introduced from a gas inlet tube 12 arranged in the downstream side of the discharge space, whereby a film of an amorphous or microcrystalline non-single crystal gallium nitride semiconductor is formed on a surface of a substrate set on the substrate holder 3.

In this case, as the substrate, the dissimilar semiconductor mainly containing silicon itself may be set on the substrate holder 3, or in alternative, it is also possible that the dissimilar semiconductor is formed on a surface of another substrate, and the substrate is set on the substrate holder 3. The light emission layer is formed on the dissimilar semiconductor mainly containing silicon. In the case where a nitride semiconductor layer is formed as the light emission layer, it may be formed continuously to the nitride semiconductor layer contributing to charge injection by changing the film forming conditions.

It depends on the species of the substrate, the temperature of the substrate, the flow amount and the pressure of the gas and the discharge conditions as to whether the nitride semiconductor layer becomes amorphous, microcrystalline, polycrystalline of highly oriented columnar growth, or single crystal. The temperature of the substrate is preferably from 100 to 600° C., and accordingly, the nitride semiconductor layer in the invention is preferably formed on the surface of the dissimilar semiconductor at a temperature of 600° C. or lower.

As described in the foregoing, in the case where the nitride semiconductor layer contributing to charge injection is formed on the surface of the silicon substrate through the light emission layer (formed directly on the surface of the silicon substrate when the light emission layer is the nitride semiconductor layer), because the layer can be formed at a high temperature of 1,000° C., there is generally such a problem that cracks are formed in the nitride semiconductor layer after cooling due to the difference in thermal expansion coefficient between the silicon and the nitride semiconductor. In the invention, however, because the layer can be formed at a relatively low temperature of 600° C. or less, the problem does not occur, but a uniform film can be formed.

According to the conventional film formation process, it is necessary even in the case where silicon is simply used as a substrate that a buffer layer is formed on the surface of the silicon substrate, and the nitride semiconductor layer is then formed thereon because of the foregoing reasons. In the invention, however, the nitride semiconductor layer can be formed directly on the surface of the dissimilar semiconductor through the light emission layer (formed directly on the surface of the silicon substrate when the light emission layer is the nitride semiconductor layer) because there is no problem in film formation. According thereto, a heterogeneous junction without any structural defect is formed between the nitride semiconductor and the dissimilar semiconductor through the light emission layer. In the case where the light emission layer is the nitride semiconductor layer, the heterogeneous junction is directly formed.

In the case where the temperature of the substrate is high and/or the case where the flow amount of the raw material gas of the Group IIIA elements is low, microcrystals or a single crystal is liable to be formed. For example, in the case where the flow amount the raw material gas of the Group IIIA elements is small, the film is liable to be crystalline even when the temperature of the substrate is lower than 300° C., and when the temperature of the substrate is higher than 300° C., the film is liable to be crystalline even in the case where the flow amount the raw material gas of the Group IIIA elements is large in comparison to the case under the low temperature conditions. In the case where $H_2$ discharge is carried out, crystallization proceeds in comparison to the case where it is not carried out.

An organic metallic compound containing indium or aluminum can be used instead of trimethyl gallium, and these may be used as a mixture. The organic metallic compounds may be separately introduced from the gas inlet tube 11.

As the raw material of the Group IIIA elements in the nitride semiconductor layer, organic metallic compounds containing one or more element selected from Al, Ga and In can be used.

As the organic metallic compounds, liquids and solids of trimethyl aluminum, triethyl aluminum, t-butyl aluminum, trimethyl gallium, triethyl gallium, t-butyl gallium, trimethyl indium, triethyl indium and t-butyl indium are vaporized and used solely or in a mixed state after bubbling with a carrier gas. Examples of the carrier gas include a rare gas, such as He and Ar, an elemental gas, such as $H_2$ and $N_2$, a hydrocarbon, such as methane and ethane, and a carbon halide, such as $CF_4$ and $C_2F_6$.

As the raw material of nitrogen, gases and liquids of $N_2$, $NH_3$, $NF_3$, $N_2H_4$ and methylhydrazine can be used as they are, after vaporization or after bubbling with a carrier gas.

In the nitride semiconductor layer, the film may be doped with an element for controlling p-type or n-type conductivity. Examples of an element that can be doped for an n-type include Li belonging to Group IA (Group No. 1 in Revised Edition of IUPAC Nomenclature of Inorganic Chemistry in 1989); Cu, Ag and Au belonging to Group IB (Group No. 11 in Revised Edition of IUPAC Nomenclature of Inorganic Chemistry in 1989); Mg belonging to Group IIA (Group No. 2 in Revised Edition of IUPAC Nomenclature of Inorganic Chemistry in 1989); Zn belonging to Group IIB (Group No. 12 in Revised Edition of IUPAC Nomenclature of Inorganic Chemistry in 1989); Si, Ge, Sn and Pb belonging to Group IVA (Group No. 14 in Revised Edition of IUPAC Nomenclature of Inorganic Chemistry in 1989); and S, Se and Te belonging to Group VIA (Group No. 16 in Revised Edition of IUPAC Nomenclature of Inorganic Chemistry in 1989).

Examples of an element that can be doped for a p-type include Li, Na and K belonging to Group IA; Cu, Ag and Au belonging to Group IB; Be, Mg, Ca, Sr, Ba and Ra belonging to Group IIA; Zn, Cd and Hg belonging to Group IIB; C, Si, Ge, Sn and Pb belonging to Group IVA; S, Se and Te belonging to Group VIA (Group No. 16 in Revised Edition of IUPAC Nomenclature of Inorganic Chemistry in 1989); Cr, Mo and W belonging to Group VIB (Group No. 6 in Revised Edition of IUPAC Nomenclature of Inorganic Chemistry in 1989); and Fe belonging to Group VIII (Group No. 8 in Revised Edition of IUPAC Nomenclature of Inorganic Chemistry in 1989), Co (belonging to Group No. 9 in Revised Edition of IUPAC Nomenclature of Inorganic Chemistry in 1989) and Ni (belonging to Group No. 10 in Revised Edition of IUPAC Nomenclature of Inorganic Chemistry in 1989) belonging to Group VIII.

Among the foregoing elements, Si, Ge and Sn are preferred as an element for forming an n-type, and Be, Mg, Ca, Zn and Sr are preferred as an element for forming a p-type.

Upon doping, $SiH_4$, $Si_2H_6$, $GeH_4$, $GeF_4$ and $SnH_4$ can be used for forming an n-type, and $BeH_2$, $BeCl_2$, $BeCl_4$, cyclopentadienyl magnesium, dimethyl calcium, dimethyl strontium, dimethyl zinc and diethyl zinc can be used in a gaseous state for forming an i-type or a p-type. The known methods, such as thermal diffusion and ion injection, can be used for doping the elements in the film.

Specifically, a gas at least containing one or more elements selected from C, Se, Ge and Sn or a gas at least containing one or more elements selected from Be, Mg, Ca, Zn and Sr is introduced from the downstream side of the discharge space (i.e., through the gas inlet tube 11 or the gas inlet tube 12), whereby an amorphous or microcrystalline nitride semiconductor having an arbitrary conductive type, e.g., an n-type and a p-type, can be obtained. In the case where the element is C, carbon of the organic metallic compound can be used depending on the conditions.

In the apparatus described in the foregoing, active nitrogen or active hydrogen formed with discharge energy may be independently controlled, or in alternative, a gas containing both nitrogen atoms and hydrogen atoms, such as an $NH_3$ gas, may be used. Furthermore, a hydrogen gas may be added. Such conditions may also be employed that active hydrogen is formed and released from the organometal compound. According to the constitution, Group IIIA element atoms and nitrogen atoms thus activated are present on the surface of the substrate in a controlled state, and the hydrogen atoms convert a methyl group and an ethyl group to inactive molecules, such as methane and ethane, and therefore, an amorphous or crystalline film having substantially no or completely no carbon introduced with suppressed film defects can be formed even at a low temperature.

In the apparatus described in the foregoing, as a unit for activation, high frequency discharge and microwave discharge, as well as an electron cyclotron resonance method and a helicon plasma method, may be used solely or in combination of two or more thereof. While high frequency discharge and microwave discharge are used in FIG. 6, both the two units may be microwave discharge or high frequency discharge. Furthermore, both the two units may be of an electron cyclotron resonance method or a helicon plasma method. In the case where discharge is carried out by high frequency discharge, a high frequency oscillator used may be either an induction type or a capacitive type. The frequency herein is preferably from 50 kHz to 100 MHz.

In the case where plural different activation units (excitation units) are used, it is necessary that discharge occurs simultaneously at the same pressure, and a difference in pressure may be provided between the discharge region and the film forming region (inside the vessel 1). In the case where discharge is carried out at the same pressure, when plural different activation units (excitation units), for example, microwave and high frequency discharge, are used, excitation energy of the excitation species can be largely changed, which is effective for controlling the film quality.

In the formation of the nitride semiconductor layer, by using the film formation method by low temperature growth containing hydrogen, junction defects at the junction interface can be preferably inactivated, and simultaneously, defects formed after the film formation due to the difference in thermal expansion are prevented, whereby a satisfactory element can be formed.

The nitride semiconductor layer can also be formed in such an atmosphere that at least hydrogen is activated, such as a reactive vapor deposition method, ion plating and reactive sputtering. In addition thereto, the ordinary organic metal gas phase growing method and the ordinary molecular beam epitaxy method can also be used, and simultaneous use of active nitrogen or active hydrogen is effective. Moreover, hydrogenation can be carried out with hydrogen plasma or hydrogen ions after the film formation.

In the case where a compound layer containing one or more element selected from Group IIIA elements and carbon and/or oxygen is formed as the fluorescent compound layer containing a fluorescent inorganic compound, a film that can be obtained through the foregoing film formation at a low substrate temperature can be utilized.

An example of the semiconductor light emission element according to the invention will be described. The same symbols are attached to the members having the same functions throughout all the figures, and descriptions thereof are omitted. FIG. 1 is an enlarged cross sectional view showing an example of the semiconductor light emission element (heterogeneous junction light emission diode) according to the invention. In FIG. 1, numerals 20 and 23 denote electrodes, 21 denotes a nitride semiconductor layer contributing to charge injection, 22 denotes a dissimilar semiconductor (semiconductor substrate), 24 denotes a light emission layer, and 30 and 31 denote wirings. In the case where light is brought out in the direction of the electrode 20, the electrode is transparent to the wavelength of emitted light.

Figure 2:
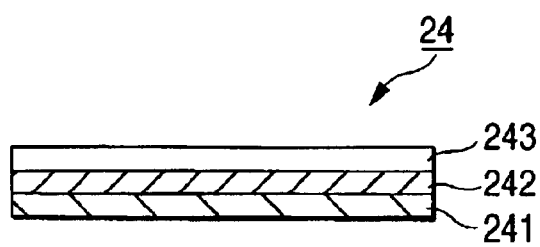
FIG. 2 is an enlarged cross sectional view showing one example of the constitution of the light emission layer in the semiconductor light emission element of the invention.
Figure 3:
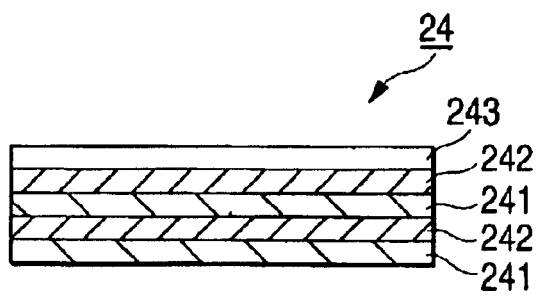
FIG. 3 is an enlarged cross sectional view showing another example of the constitution of the light emission layer in the semiconductor light emission element of the invention.

FIG. 2 is an enlarged cross sectional view showing an example of a light emission layer having one pair of a quantum well structure. FIG. 3 is an enlarged cross sectional view showing an example of a light emission layer having two or more pairs of a quantum well structure. In FIGS. 2 and 3, 241 and 243 denote barriers for producing a quantum well, and 242 denote a well layer. The barrier 241 corresponds to the first layer of the light emission layer, the well layer 242 corresponds to the second layer of the light emission layer, and the barrier 243 corresponds to the third layer of the light emission layer.

Semiconductor Composite Element

A composite element having high performance and a simple structure (semiconductor composite element of the invention) can be formed with the semiconductor light emission element of the invention in such a manner that semiconductor elements having functions that are different from the semiconductor light emission element of the invention are formed on the dissimilar semiconductor (semiconductor substrate), and the dissimilar semiconductor (semiconductor substrate) is shared thereby. The semiconductor elements having different functions (e.g., transistors and light receiving elements) are formed with a heterogeneous p-n junction using a nitride semiconductor layer at least containing one or more elements selected from Group IIIA elements and one or more elements selected from Group VA elements, and ordinary photodiodes of Schottky type or a p-n junction with silicon, germanium or GaAs, MOS field effect transistors and hetero bipolar transistors can be used. The semiconductor elements having different functions (transistors and light emission elements) are connected to driving circuits to receive or transmit operation signals.

Figure 4:
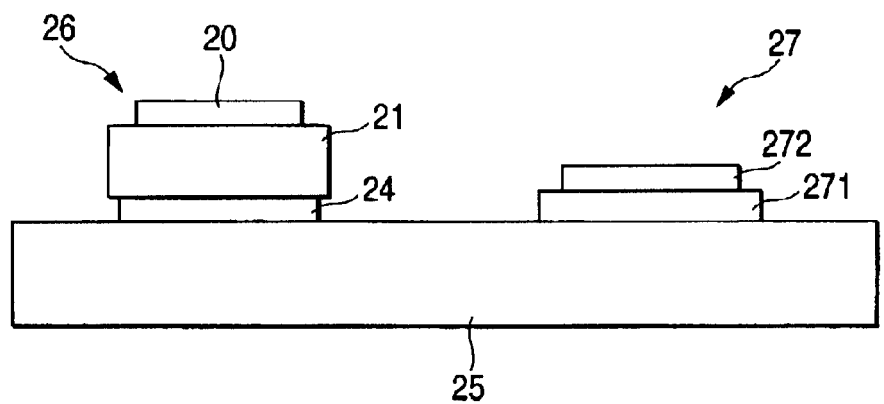
FIG. 4 is an enlarged cross sectional view showing one example of the constitution of the semiconductor composite element of the invention.

An example of the semiconductor composite element according to the invention will be described. FIG. 4 is an enlarged cross sectional view showing an example of the semiconductor composite element according to the invention. In FIG. 4, numeral 25 denotes a semiconductor substrate (dissimilar semiconductor), 26 denotes a semiconductor light emission element, and 27 denotes a semiconductor light receiving element. In the semiconductor light receiving element 27, numeral 271 denotes a light receiving layer, and 272 denotes an electrode.

The semiconductor composite element shown in FIG. 4 is such a light receiving and emission element that the semiconductor light emission element 26 and the semiconductor light receiving element 27 are arranged in parallel on the single semiconductor substrate 25. The semiconductor light emission element 26 and the semiconductor light receiving element 27 may be electrically connected through a circuit (driving circuit), and according to the constitution, it is possible that an external optical signal is received by the semiconductor light receiving element 27, and the semiconductor light emission element 26 is driven by a photoelectric current generated by the reception of light.

Figure 5:
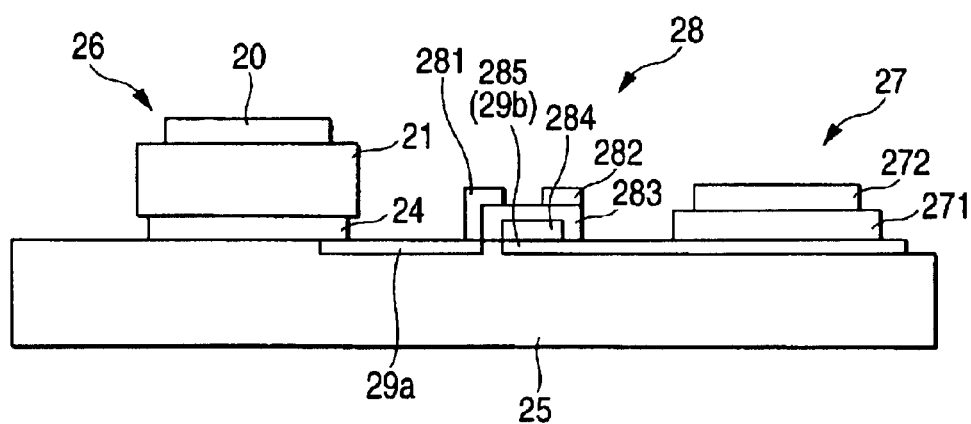
FIG. 5 is an enlarged cross sectional view showing another example of the constitution of the semiconductor composite element of the invention.

FIG. 5 is an enlarged cross sectional view showing another example of the semiconductor composite element according to the invention. In FIG. 5, numeral 25 denotes a semiconductor substrate (dissimilar substrate), 26 denotes a semiconductor light emission element, 27 denotes a semiconductor light receiving element, 28 denotes a transistor for driving the semiconductor light emission element 26, and 29*a* denotes a circuit (driving circuit) for electrically connecting the semiconductor light emission element 26 and the transistor 28, 29*b* denotes a circuit (driving circuit) for electrically connecting the semiconductor light receiving element 27 and the transistor 28, i.e., such a light receiving and emission element is shown that the semiconductor light emission element 26, the semiconductor light receiving element 27 and the transistor 28 are arranged in parallel on the single semiconductor substrate 25. In the transistor 28, numeral 281 denotes a source electrode, 282 denotes a drain electrode, 283 denotes a semiconductor layer, 284 denotes a dielectric layer, and 285 denotes a gate electrode. In the light receiving and emission element shown in FIG. 5, the gate electrode in the transistor 28 also functions as the circuit (driving circuit) 29b, and the light receiving layer 271 is formed on the circuit 29b (i.e., the gate electrode 285) to provide the semiconductor light receiving element 27, whereby the semiconductor light receiving element 27 and the transistor 28 are electrically connected.

In the light receiving and emission element shown in FIG. 5, the semiconductor light emission element 26 and the transistor 28 are electrically connected with the circuit 29, and thus the semiconductor light emission element 26 can be driven with the driving electric current (signal) of the transistor 28. Furthermore, the semiconductor light receiving element 27 and the transistor 28 are electrically connected with the circuit (driving circuit), and thus it is also possible that an external optical signal is received by the semiconductor light receiving element 27, the transistor is driven by a photoelectric current generated by the reception of light, and the semiconductor light emission element 26 is driven by the driving electric current (signal).

The semiconductor element containing the semiconductor light emission element of the invention using the nitride semiconductor at least containing one or more elements selected from Group IIIA elements and one or more elements selected from Group VA elements has a light emission function over the entire wavelength range, which has not been realized by the conventional amorphous or microcrystalline non-single crystal semiconductor, and therefore, the light input and the light output can be varied the entire range of from red to ultraviolet. The element is excellent in light resistance, heat resistance and oxidation resistance and enables high speed response, and it is also excellent in high light transmittance, high optical sensitivity and high speed responsiveness, whereby it can be used as a hybrid device formed by combining an electronic device and a light emission device, such as the semiconductor composite element of the invention described in the foregoing. In addition to the case where an optical semiconductor element is solely used, a tandem device can be formed by combining optical semiconductor elements having optical input and output wavelengths different from each other, and thus effective utilization of light of a wavelength range of from the visible region to the ultraviolet region and wavelength multiplexing of optical input and optical output are realized. As a result, the amount of information that can be simultaneously handled can be exponentially increased, and the device can be used as a two-dimensional optical information processing element.

Specifically, examples thereof include devices utilizing electrons, photoconductivity or photovoltaic effect, such as a high efficiency solar cell, a high speed FET, a high sensitivity sensor and a high sensitivity avalanche optical sensor, devices utilizing light emission, such as a large area LED, a display and a full color flat display, devices relating to optical input and optical output, such as an optical modulation device, a light wavelength conversion device and an optical interconnecting element, and composite devices having pluralities of these functions.

EXAMPLE

The invention will be described in more detail with reference to the following examples, but the invention is not construed as being limited thereto. The unit of 1 sccm (standard cubic centimeter per minute) means a flow amount of 1 cm$^3$/min of a gas under 1,013.25 hPa (1 atm) at 0° C.

Example 1
Formation of Light Emission Layer

Au is vapor-deposited to a thickness of 0.1 $\mu$m to provide an ohmic contact electrode on one surface of a p-type silicon substrate (thickness: 350 $\mu$m) having a resistivity of 2 $\Omega$cm and a plane direction (100), which has been etched with a hydrofluoric acid aqueous solution having a concentration of 10% by weight. The silicon substrate is put on the substrate holder 3 of the layer formation apparatus shown in FIG. 6 in such a manner that the surface opposite to the surface having the electrode thus vapor-deposited faces the gas inlet tubes, and after evacuating the interior of the vessel 1 to vacuum through the exhaust opening 2, the substrate is heated to 300° C. with the heater 4. An $N_2$ gas is introduced to the quartz tube 5 having a diameter of 25 mm at 2,000 sccm through the gas inlet tube 9, and discharge is carried out through the microwave waveguide tube 8 with a microwave output of 2.45 GHz set at 250 W under matching with a tuner. The reflex wave herein is 0 W. An $H_2$ gas is introduced to the quartz tube 6 having a diameter of 30 mm at 500 sccm through the gas inlet tube 10. The output of high frequency electric power at 13.56 MHz is set at 100 W, and the reflex wave herein is 0 W.

Under the foregoing state, vapor of trimethyl gallium (TMGa) maintained at 0° C. is introduced through the gas inlet tube 11 by using nitrogen as a carrier gas under bubbling at a pressure of $10^6$ Pa at 1 sccm controlled with a mass flow controller. The reaction pressure measured with Baratron vacuum gauge at this time is 65 Pa.

The film formation under the foregoing conditions is carried out for 5 minutes to form a GaN:H film (hydrogenated GaN film) having a thickness of 100 nm, which is used as the light emission layer, directly on the surface of the silicon substrate.

Formation of Nitride Semiconductor Layer Contributing to Charge Injection

Hydrogen-diluted silane is introduced at 1% by atom through the gas inlet tube 12, and under that condition, film formation is carried out for 120 minutes to form an n-type Si-doped GaN:H film (hydrogenated GaN film) having a thickness of 0.1 $\mu$m, which is used as the nitride semiconductor layer contributing to charge injection, on the light emission layer.

The hydrogen composition of the n-type Si-doped GaN:H film measured by HFS (hydrogen forward scattering) is 5% by atom. The film has an optical gap of 3.2 eV and completely transmits light having a wavelength of 380 nm or longer. A translucent Au electrode having a diameter of 3 mm is vapor-deposited thereon.

Evaluation

The hetero junction light emission diode (semiconductor light emission element) thus produced is measured for electric current and voltage characteristics, and thus a rectification function is found with respect to the forward direction and the reverse direction. The forward/reverse current ratio in a range of from ±2 V to 4V is 500 times, and thus it is found that sufficient characteristics as a light emission diode are exerted. Upon applying a voltage of 20 V to the element in the forward direction, light emission of whitish orange color is confirmed in a dark place. It is found that electrons are injected from the n-type Si-doped GaN:H film (i.e., the nitride semiconductor layer contributing to charge injection), and positive holes are injected from the p-type Si (i.e., the silicon substrate), whereby light emission is exerted by recombination thereof in the light emission layer (i.e., the GaN:H film) with junction defects in the band as emission centers.

Example 2
Formation of Light Emission Layer

The same substrate as in Example 1 is used. Film formation is carried out for 10 minutes under such conditions that hydrogen-diluted silane is introduced at 0.1% by atom from the gas inlet tube 12 to form a GaN:H film (hydrogenated GaN film) doped with a slight amount of Si having a thickness of 100 nm, which is used as a light emission layer, directly on the surface of the silicon substrate.

Formation of Nitride Semiconductor Layer Contributing to Charge Injection

Hydrogen-diluted silane is introduced at 1% by atom through the gas inlet tube 12, and under that condition, film formation is carried out for 10 minutes to form an n-type Si-doped GaN:H film (hydrogenated GaN film) having a thickness of 0.1 µm, which is used as the nitride semiconductor layer contributing to charge injection, on the light emission layer.

The hydrogen composition of the n-type Si-doped GaN:H film measured by HFS (hydrogen forward scattering) is 5% by atom. The film has an optical gap of 3.2 eV and completely transmits light having a wavelength of 380 nm or longer. An indium tin oxide electrode having a diameter of 1 mm is formed thereon by sputtering.

Evaluation

The hetero junction light emission diode (semiconductor light emission element) thus produced is measured for electric current and voltage characteristics, and thus a rectification function is found with respect to the forward direction and the reverse direction. Upon applying a voltage of 10 V to the element in the forward direction, light emission of blue color is confirmed in a dark place. It is found that electrons are injected from the n-type Si-doped GaN:H film (i.e., the nitride semiconductor layer contributing to charge injection), and positive holes are injected from the p-type Si (i.e., the silicon substrate), whereby light emission is exerted by recombination thereof in the light emission layer (i.e., the GaN:H film doped with a slight amount of Si).

Example 3
Formation of Light Emission Layer (Fluorescent Inorganic Compound)

The same substrate as in Example 1 is used. Film formation is carried out for 10 minutes under the conditions of only the trimethyl gallium gas and the nitrogen remote plasma and in a state that the substrate temperature is a room temperature in Example 1 to form a film containing a fluorescent inorganic compound having a thickness of 10 nm, which is used as a light emission layer, directly on the surface of the silicon substrate. The film containing the fluorescent inorganic compound contains about 30% by atom of oxygen and about 10% by atom of carbon, as well as Ga and nitrogen.

A film formed under the same conditions on the same substrate as in Example 1 for 1 hour is taken out into the air and then irradiated with an ultraviolet ray having a wavelength of 325 nm from a He—Cd laser. The film exhibits strong blue fluorescence.

Formation of Nitride Semiconductor Layer Contributing to Charge Injection

After forming the light emission layer, the vacuum vessel 1 is returned to the atmospheric pressure and then set at 300° C. by vacuum heating, and hydrogen-diluted silane is introduced at 1% by atom through the gas inlet tube 12. Under that condition, film formation is carried out for 120 minutes to form an n-type Si-doped GaN:H film (hydrogenated GaN film) having a thickness of 0.1 µm, which is used as the nitride semiconductor layer contributing to charge injection, on the light emission layer.

The hydrogen composition of the n-type Si-doped GaN:H film measured by HFS (hydrogen forward scattering) is 5% by atom. The film has an optical gap of 3.2 eV and completely transmits light having a wavelength of 380 nm or longer. An indium tin oxide electrode having a diameter of 1 mm is formed thereon by sputtering.

Evaluation

The hetero junction light emission diode (semiconductor light emission element) thus produced is measured for electric current and voltage characteristics, and thus a rectification function is found with respect to the forward direction and the reverse direction. Upon applying a voltage of 10 V to the element in the forward direction, light emission of blue color is confirmed in a dark place. It is found that electrons are injected from the n-type Si-doped GaN:H film (i.e., the nitride semiconductor layer contributing to charge injection), and positive holes are injected from the p-type Si (i.e., the silicon substrate), whereby light emission is exerted by recombination thereof in the light emission layer (i.e., a film made of a fluorescent inorganic compound) and excitation of a fluorescent substance.

Example 4
Formation of Light Emission Layer (Light Emission Layer having Quantum Well Structure)

By using the same substrate as in Example 1, a light emission layer having a quantum well structure is formed directly on the silicon substrate. Film formation is carried out for 10 minutes in such a state that vapor of trimethyl aluminum (TMA) maintained at −10° C. is introduced into the conditions as in Example 1 by using nitrogen as a carrier gas at 1 sccm, whereby an $Al_{0.2}Ga_{0.8}N:H$ film (first layer) is produced. Thereafter, the valve for TMA is closed, and film formation is carried out for 5 minutes in such a state that a nitrogen gas is introduced at 1 sccm controlled with a mass flow controller in the reaction region with trimethyl indium (TMIn) maintained at 20° C., whereby an $In_{0.2}Ga_{0.8}N:H$ film (second layer) is produced. The foregoing operations are repeated 5 times by 60 seconds to form a multilayer structure containing 5 layers of the AlGaN:H films formed by alternately accumulating the AlGaN:H films and the GaInN:H films. Finally, one layer of the AlGaN:H film (third layer) is accumulated. It is expected from a separate experiment for single layers that the AlGaN:H layer has a thickness of 30 Å, and the GaInN:H layer has a thickness of 25 Å.

Formation of Nitride Semiconductor Layer Contributing to Charge Injection

Furthermore, hydrogen-diluted silane is introduced at 1% by atom through the gas inlet tube 12, and under that condition, film formation is carried out for 10 minutes to form an n-type Si-doped GaN:H film (hydrogenated GaN film) having a thickness of 0.1 µm, which is used as the nitride semiconductor layer contributing to charge injection, on the light emission layer.

The hydrogen composition of the Si-doped GaN:H film measured by HFS (hydrogen forward scattering) is 5% by atom. The film has an optical gap of 3.2 eV and completely transmits light having a wavelength of 380 nm or longer. An indium tin oxide electrode having a diameter of 1 mm is formed thereon by sputtering.

The hetero junction light emission diode (semiconductor light emission element) thus produced is measured for electric current and voltage characteristics, and thus a rectification function is found with respect to the forward direction and the reverse direction. Upon applying a voltage of 10 V to the element in the forward direction, light emission of green color is confirmed in a dark place. It is found that electrons are injected from the n-type Si-doped GaN:H film (i.e., the nitride semiconductor layer contributing to charge injection), and positive holes are injected from the p-type Si (i.e., the silicon substrate), whereby light emission is exerted by recombination thereof in the quantum well layer as the light emission layer.

Example 5

After producing a hetero junction light emission diode (semiconductor light emission element) in the same manner as in Example 1, a thin film transistor and a semiconductor light receiving element are produced in parallel to the hetero junction light emission diode on the silicon substrate, on which the hetero junction light emission diode has been produced. A high resistance silicon substrate having a p-type layer having a thickness of 10 μm formed on the surface thereof is used as the silicon substrate. The parts of the p-type layer among the elements are etched to produce connecting wire parts among the respective elements, and Al is vapor-deposited on the connecting wire parts among the respective elements to form driving circuits, whereby the hetero junction light emission diode (light emission layer) and the electrode (source electrode) of the thin film transistor are electrically connected, and the electrode (drain electrode) of the thin film transistor and the semiconductor light receiving element (light receiving layer) are electrically connected.

Evaluation

Upon inputting light from a blue LED in the semiconductor light receiving element, a photoelectric current generated in the light receiving layer of the semiconductor light receiving element is input into the gate electrode of the thin film transistor. Upon inputting in the gate electrode, an electric current is output from the drain electrode of the thin film transistor, and the hetero junction light emission diode can be driven (light emission) by the drain electric current output.

Production of Thin Film Transistor

The p-type layer (p-type layer electrically connected to the semiconductor light receiving element) of the silicon substrate is used as a gate electrode, and a dielectric amorphous AlGaN:H film is formed thereon to a thickness of 100 nm to form a transparent dielectric layer. An undoped GaN:H film is then formed on the transparent dielectric layer to form a transparent semiconductor layer. Furthermore, ITO is formed on the transparent semiconductor layer by sputtering to form two regions each having a width and a length of 200 μm, a thickness of 100 nm and a gap width of 50 μm, which are used as a transparent source electrode and a transparent drain electrode. The transparent source electrode is formed to connect to the p-type layer (p-type layer electrically connected to the hetero junction light emission diode) on the silicon substrate. Thus, an inversely staggered thin film transistor (TFT) is produced.

The transparent dielectric layer and the transparent semiconductor layer are produced in the following manner.

The silicon substrate having a gate electrode is placed on the substrate holder 3 of the layer formation apparatus shown in FIG. 6, and after evacuating the interior of the film forming chamber 1 to vacuum through the exhaust opening 2, the substrate is heated to 400° C. with the heater 4. An $N_2$ gas is introduced to the quartz tube 5 having a diameter of 25 mm at 2,000 sccm through the gas inlet tube 9, and discharge is carried out through the microwave waveguide tube 8 with a microwave output of 2.45 GHz set at 250 W under matching with a tuner. The reflex wave herein is 0 W. An $H_2$ gas is introduced to the quartz tube 6 having a diameter of 30 mm at 1,000 sccm through the gas inlet tube 10. The output of high frequency electric power at 13.56 MHz is set at 100 W, and the reflex wave herein is 0 W. Under the foregoing state, vapor of trimethyl gallium (TMGa) maintained at 0° C. is introduced through the gas inlet tube 12 by using hydrogen as a carrier gas under bubbling at 0.3 seem controlled with a mass flow controller. The reaction pressure measured with Baratron vacuum gauge at this time is 66.65 Pa (0.5 Torr). The film formation is carried out for 60 minutes to form an n-type undoped GaN:H film having a thickness of 200 nm, which is used as the transparent semiconductor layer. The GaN:H film has a hydrogen concentration of 5% by atom.

The transparent dielectric layer is produced in the same conditions as in the foregoing except that trimethyl aluminum is also introduced along with trimethyl gallium (TMGa) in the same amount as TMGa, and the film formation is carried out for 90 minutes, whereby an amorphous AlGaN:H film having a thickness of 100 nm is produced. The AlGaN:H film has a hydrogen concentration of 15% by atom.

Production of Semiconductor Light Receiving Element

The silicon substrate having the p-type layer (p-type layer functioning as the gate electrode of the thin film transistor) is placed on the substrate holder 3 of the layer forming apparatus shown in FIG. 6. The interior of the vacuum vessel 1 is evacuated to vacuum with a rotary pump and a mechanical booster pump connected to the exhaust opening 2, and then the substrate is heated to 500° C. with the heater 4. An $N_2$ gas is introduced to the quartz tube 5 having a diameter of 25 mm at 1,000 sccm through the gas inlet tube 9, and discharge is carried out through the microwave waveguide tube 8 with a microwave output of 2.45 GHz set at 250 W under matching with a tuner. The reflex wave herein is 0 W. An $H_2$ gas is introduced to the quartz tube 6 having a diameter of 30 mm at 500 sccm through the gas inlet tube 10. The output of high frequency electric power at 13.56 MHz is set at 100 W. The reflex wave herein is 0 W.

Under the foregoing state, vapor of trimethyl gallium (TMGa) maintained at 0° C. is introduced through the gas inlet tube 11 by using an $N_2$ gas as a carrier gas under bubbling at 0.2 sccm controlled with a mass flow controller. Furthermore, trimethyl aluminum maintained at 50° C. and bubbled with $N_2$ through the gas in let tube 11 is introduced through a mass flow controller at 2 sccm by using an $N_2$ gas as a carrier gas under bubbling.

A silane gas having been diluted with hydrogen to 100 ppm is introduced into the reaction region at 10 sccm with the gas inlet tube 12 through a mass flow controller. The reaction pressure inside the film forming chamber 1 at this time measured with a diaphragm vacuum gauge (trade name: Baratron, produced by Baratron Products, Inc.) is 66.5 Pa (0.5 Torr). Under that state, film formation is carried out on the surface of the quartz substrate for 100 minutes to form an Si-doped $Al_{0.8}Ga_{0.2}N:H$ film having a thickness of 100 nm, which is used as the light receiving layer. The hydrogen content of the film measured by the IR method (infrared spectroscopic analysis) is 5% by atom. An indium tin oxide electrode having a diameter of 1 mm is formed on the light receiving layer by sputtering. Thus, the semiconductor light receiving element (ultraviolet to visible light receiving element) is produced.

According to the invention as described in the foregoing, a simple and low cost semiconductor light emission element exerting high performance and a production process thereof can be provided. Furthermore, such a semiconductor light emission element capable of forming a semiconductor composite element that has plural semiconductor elements having different functions on the same dissimilar semiconductor (semiconductor substrate) and has high performance and a simple structure, and the semiconductor composite element can be also provided.

The entire disclosure of Japanese Patent Application No. 2002-076202 filed on Mar. 19, 2002 including specification, claims, drawings and abstract is incorporated herein by reference in its entirety.

What is claimed is:

1. A semiconductor light emission element comprising:
a nitride semiconductor layer at least comprising one or more elements selected from Group IIIA elements and one or more elements selected from Group VA elements;
a semiconductor having a conductivity type different from the nitride semiconductor layer and being dissimilar to the nitride semiconductor layer; and
a light emission layer provided between the dissimilar semiconductor and the nitride semiconductor,
wherein electrons or positive holes are injected from semiconductors of the dissimilar semiconductor and the nitride semiconductor layer to the light emission layer to carry out light emission and wherein the nitride semiconductor layer contains hydrogen and/or a halogen element in an amount of from 0.1 to 50% by atom.

2. The semiconductor light emission element as claimed in claim 1, wherein the light emission layer contains a fluorescent inorganic compound.

3. A semiconductor light emission element comprising:
a nitride semiconductor layer at least comprising one or more elements selected from Group IIIA elements and one or more elements selected from Group VA elements;
a semiconductor having a conductivity type different from the nitride semiconductor layer and being dissimilar to the nitride semiconductor layer; and
a light emission layer provided between the dissimilar semiconductor and the nitride semiconductor,
wherein electrons or positive holes are injected from semiconductors of the dissimilar semiconductor and the nitride semiconductor layer to the light emission layer to carry out light emission and wherein the light emission layer at least contains one or more elements selected from Group IIIA elements with carbon and/or oxygen.

4. The semiconductor light emission element as claimed in claim 1, wherein the light emission layer at least contains one or more elements selected from Group IIIA elements and one or more elements selected from Group VA elements.

5. The semiconductor light emission element as claimed in claim 1, wherein the light emission layer at least contains one or more elements selected from Group IIIA elements, one or more elements selected from Group VA elements and a rare earth element.

6. The semiconductor light emission element as claimed in claim 4, wherein the light emission layer has a quantum well structure.

7. The semiconductor light emission element as claimed in claim 6, wherein the light emission layer has, as the quantum well structure, a structure comprising one or more pairs of a first layer at least containing one or more elements selected from Group IIIA elements and one or more elements selected from Group VA elements and a second layer at least containing one or more element selected from Group IIIA elements and having an optical gap smaller than that of the first layer, each of which has a thickness of from 5 to 200 Å and sequentially accumulated, and a third layer having the same composition as the first layer further accumulated.

8. The semiconductor light emission element as claimed in claim 1, wherein the dissimilar semiconductor is a semiconductor mainly containing one or more elements selected from C, Si and Ge.

9. A semiconductor light emission element comprising:
a nitride semiconductor layer at least comprising one or more elements selected from Group IIIA elements and one or more elements selected from Group VA elements;
a semiconductor having a conductivity type different from the nitride semiconductor layer and being dissimilar to the nitride semiconductor layer; and
a light emission region between the dissimilar semiconductor and the nitride semiconductor,
wherein electrons or positive holes are injected from semiconductors of the dissimilar semiconductor and the nitride semiconductor layer to the light emission layer to carry out light emission, and wherein the dissimilar semiconductor is a semiconductor mainly containing one or more elements selected from Group IIIA elements and one or more elements selected from P and As.

10. The semiconductor light emission element as claimed in claim 1, wherein the dissimilar semiconductor is a semiconductor mainly containing silicon or GaAs.

11. The semiconductor light emission element as claimed in claim 10, wherein the silicon is crystalline silicon, polycrystalline silicon, microcrystalline silicon or amorphous silicon.

12. The semiconductor light emission element as claimed in claim 1, wherein the dissimilar semiconductor is a semiconductor substrate.

13. The semiconductor light emission element as claimed in claim 1, wherein the dissimilar semiconductor is a p-type, and the nitride semiconductor layer is an n-type containing one or more elements selected from C, Si, Ge and Sn.

14. The semiconductor light emission element as claimed in claim 1, wherein the dissimilar semiconductor is an n-type, and the nitride semiconductor layer is a p-type containing one or more elements selected from Be, Mg, Ca, Zn and Sr.

15. A semiconductor composite element comprising:
a semiconductor light emission element; and
a semiconductor element having a function that is different from that of the semiconductor light emission element,
wherein the semiconductor light emission element comprises:
a nitride semiconductor layer at least comprising one or more elements selected from Group IIIA elements and one or more elements selected from Group VA elements;
a semiconductor having a conductivity type different from the nitride semiconductor layer and being dissimilar to the nitride semiconductor layer; and
a light emission layer provided between the dissimilar semiconductor and the nitride semiconductor, electrons or positive holes being injected from semiconductors of the dissimilar semiconductor and the nitride semiconductor layer to the light emission layer to carry out light emission, and wherein the semiconductor element having a function that is different from that of the semiconductor light emission element is provided on the dissimilar semiconductor of the semiconductor light emission element in parallel with the semiconductor light emission element.

16. The semiconductor composite element as claimed in claim 15, wherein the semiconductor element having a function that is different from that of the semiconductor light emission element is a semiconductor element having a nitride semiconductor layer at least comprising one or more elements selected from Group IIIA elements and one or more elements selected from Group VA elements.

17. The semiconductor composite element as claimed in claim 15, wherein the semiconductor element having a function that is different from that of the semiconductor light emission element is selected from a transistor and a semiconductor light receiving element.

18. The semiconductor composite element as claimed in claim 15, wherein the semiconductor light emission element and the semiconductor element having a function that is different from that of the semiconductor light emission element are electrically connected with each other via a driving circuit formed on the dissimilar semiconductor of the semiconductor light emission element.

19. A process for producing a semiconductor light emission element comprising a nitride semiconductor layer at least comprising one or more elements selected from Group IIIA elements and one or more elements selected from Group VA elements, a semiconductor having a conductivity type different from the nitride semiconductor layer and being dissimilar to the nitride semiconductor layer, and a light emission layer provided between the dissimilar semiconductor and the nitride semiconductor, electrons or positive holes being injected from semiconductors of the dissimilar semiconductor and the nitride semiconductor layer to the light emission layer to carry out light emission, the process comprising the steps of:

introducing a gas or a material containing nitride into a reaction chamber; and forming the nitride semiconductor layer at a temperature of 600° C. or less.

* * * * *